United States Patent
Kadota et al.

(10) Patent No.: US 6,617,183 B2
(45) Date of Patent: Sep. 9, 2003

(54) METHOD FOR FORMING P-TYPE SEMICONDUCTOR FILM AND LIGHT EMITTING DEVICE USING THE SAME

(75) Inventors: Michio Kadota, Kyoto (JP); Yasuhiro Negoro, Nagaokakyo (JP); Yoshinori Miura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/838,031

(22) Filed: Apr. 19, 2001

(65) Prior Publication Data

US 2001/0034115 A1 Oct. 25, 2001

(30) Foreign Application Priority Data

Apr. 19, 2000 (JP) .......................................... 2000-118347

(51) Int. Cl.⁷ ............................................ H01L 21/265
(52) U.S. Cl. ......................... 438/22; 438/518; 438/483; 438/104
(58) Field of Search ................................. 438/22, 24, 46, 438/479, 104, 518; 257/96, 103; 427/255.34; 313/498; 204/298.12, 298.13, 298.27, 298.29

(56) References Cited

U.S. PATENT DOCUMENTS

| | | | |
|---|---|---|---|
| 5,227,328 A | 7/1993 | Khan et al. | |
| 5,262,349 A | 11/1993 | Yoshida | |
| 5,324,365 A | 6/1994 | Niwa | |
| 5,399,185 A | 3/1995 | Berthold et al. | |
| 5,432,397 A * | 7/1995 | Koike et al. | 310/358 |
| 5,699,035 A | 12/1997 | Ito et al. | |
| 5,976,958 A | 11/1999 | Rajavel et al. | |
| 6,057,561 A * | 5/2000 | Kawasaki et al. | 257/94 |
| 6,146,765 A * | 11/2000 | Mitsui et al. | 428/428 |
| 6,259,016 B1 * | 7/2001 | Nagami et al. | 136/265 |
| 6,291,085 B1 * | 9/2001 | White et al. | 428/642 |
| 6,423,983 B1 * | 7/2002 | Narayan et al. | 257/96 |
| 6,448,585 B1 * | 9/2002 | Kadota | 257/103 |
| 2002/0084455 A1 * | 7/2002 | Cheung | 257/43 |

FOREIGN PATENT DOCUMENTS

| | | |
|---|---|---|
| EP | 0541373 | 5/1993 |
| GB | 2081013 | 2/1982 |
| JP | 2142188 | 5/1990 |
| JP | 7307490 | 11/1995 |
| WO | 0008691 | 2/2000 |
| WO | 0143165 | 6/2001 |

OTHER PUBLICATIONS

Ohtomo et al, "MgZnO as a II–VI Widegap Semiconductor Alloy" Applied Physics Letters vol. 72, No. 19 pp2466–2468.*

* cited by examiner

Primary Examiner—Savitri Mulpuri
(74) Attorney, Agent, or Firm—Keating & Bemmett,LLP (57) ABSTRACT

A method for forming a p-type semiconductor film comprises the steps of: providing on a substrate a group II–VI compound semiconductor film which is doped with a p-type impurity and comprises either $Mg_XZn_{1-X}O$ ($0 \leq X \leq 1$) or $Cd_XZn_{1-X}O$ ($0 \leq X \leq 1$) and activating the p-type impurity by annealing the doped semiconductor film.

6 Claims, 7 Drawing Sheets

METHOD FOR FORMING P-TYPE SEMICONDUCTOR FILM AND LIGHT EMITTING DEVICE USING THE SAME

BACKGROUND OF THE INVENTION

1. Field of the Invention

The present invention relates to a method for forming a compound semiconductor thin film containing a ZnO-based group II–VI compound semiconductor as a principal constituent, and to a light emitting device using the same.

2. Description of the Related Art

ZnO, which is a group II–VI compound semiconductor, is receiving attention as a material for light emitting devices for emitting light in the ultraviolet band, and since it is of a direct gap type, the light emission efficiency is high.

In a light emitting device, such as a light emitting diode or a semiconductor laser, a pn junction comprising a p-type semiconductor layer and an n-type semiconductor layer is formed on a substrate. Accordingly, in order to fabricate a light emitting device, a p-type semiconductor layer and an n-type semiconductor layer must be grown on a substrate. When a semiconductor layer of one conductive type is epitaxially grown on a substrate and a semiconductor layer of another conductive type is epitaxially grown thereon, it is preferable that lattice mismatching does not occur and crystal growth be carried out in a continuous process. Therefore, when a light emitting device is fabricated, it is preferable that semiconductor layers of different conductive types be deposited using the same semiconductor material.

However, in the conventional ZnO-based group II–VI compound semiconductor, it is only possible to form a single crystal or thin film of n-type conductivity, and moreover, it is only possible to form a single crystal or thin film with low resistivity.

Therefore, when a ZnO single crystal or thin film having high resistivity is required, the resistance is increased by doping the ZnO single crystal or thin film with a compensating acceptor, such as Li, Cu, or Ag. In such a case, however, only the n-type is produced, and even with the doping of impurities, it is not possible to obtain a p-type ZnO thin film. Consequently, in order to obtain a pn junction using the group II–VI compound semiconductor, the group II–VI compound semiconductor must be combined with a semiconductor of a different type, and thus lattice mismatching often occurs.

SUMMARY OF THE INVENTION

Accordingly, it is an object of the present invention to provide a method for forming a novel p-type semiconductor film including a semiconductor layer containing a compound semiconductor as a principal constituent doped with an impurity.

The above and other objects of the invention are accomplished by a method for forming a p-type semiconductor film comprising the steps of providing on a substrate a group II–VI compound semiconductor film which is doped with a p-type impurity and comprises ZnO; and activating the p-type impurity by annealing the doped semiconductor film.

In one aspect of the present invention, a method for forming a p-type semiconductor film comprises the steps of providing on a substrate a group II–VI compound semiconductor film which is doped with a p-type impurity and comprises either $Mg_xZn_{1-x}O$ ($0 \leq X \leq 1$) or $Cd_xZn_{1-x}O$ ($0 \leq X \leq 1$) and activating the p-type impurity by annealing the doped semiconductor film.

The semiconductor film providing step may include the step of sputtering a target doped with a p-type impurity and made of either $Mg_xZn_{1-x}O$ ($0 \leq X \leq 1$) or $Cd_xZn_{1-x}O$ ($0 \leq X \leq 1$) to form the semiconductor film on the substrate. Alternatively, the semiconductor film providing step may include the steps of sputtering a target made of either $Mg_xZn_{1-x}O$ ($0 \leq X \leq 1$) or $Cd_xZn_{1-x}O$ ($0 \leq X \leq 1$) to form the semiconductor film on the substrate and doping the semiconductor film with the p-type impurity. In this case, the semiconductor film may be doped with the p-type impurity by an ion implanting method.

Preferably, the p-type impurity includes an element selected from the group consisting of As, N, P, Sb, and Bi. Preferably, the semiconductor film is annealed at 450° C. or more.

By experimentation, it has been found that, by doping a semiconductor layer containing a group II–VI compound semiconductor selected from the group consisting of $Mg_xZn_{1-x}O$ and $Cd_xZn_{1-x}O$ as a principal constituent with any one of As, N, P, Sb, and Bi, followed by annealing, preferably at a temperature of 450° C. or more for at least one hour, a p-type semiconductor layer comprising the group II–VI compound semiconductor can be obtained.

Preferably, the semiconductor layer has a resistivity of $10^6$ Ω·cm or more before being doped with the impurity to obtain the p-type semiconductor layer. In the semiconductor layer having such a high resistance, the ZnO-based film has a small amount of oxygen defects. In the film having such a large resistivity, the resistance is easily decreased by doping. Preferably, the ZnO-based film is formed, in an atmosphere containing a sufficient amount of oxygen, using the ZnO-based material having a purity of 99.999% (5N) or more, and more preferably 99.9995% or more.

In another aspect of the present invention, a light emitting device includes a group II–VI compound semiconductor film containing p-type $Mg_xZn_{1-x}O$ ($0 \leq X \leq 1$) or $Cd_xZn_{1-x}O$ ($0 \leq X \leq 1$) formed by the method described above, and a group II–VI compound semiconductor film containing n-type $Mg_xZn_{1-x}O$ ($0 \leq X \leq 1$) or $Cd_xZn_{1-x}O$ ($0 \leq X \leq 1$).

In accordance with the present invention, it is possible to obtain a group II–VI compound semiconductor thin film with p-type conductivity. When a light emitting device is fabricated, it is possible to combine a p-type group II–VI compound semiconductor thin film and an n-type group II–VI compound semiconductor thin film. In particular, by using ZnO as the group II–VI compound semiconductor, it is possible to fabricate a light emitting device having an emission wavelength spectrum in the ultraviolet band.

Other features and advantages of the present invention will become apparent from the following description of the invention which refers to the accompanying drawings.

DETAILED DESCRIPTION OF EMBODIMENTS OF THE INVENTION

Figure 1A:
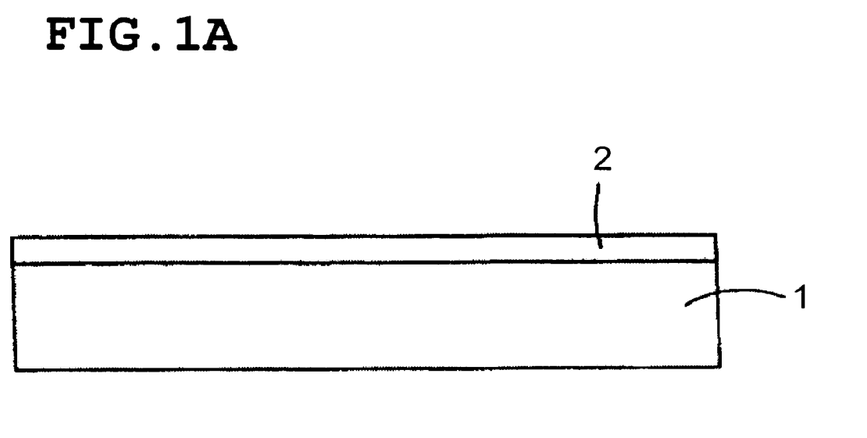
FIGS. 1A and 1B are schematic diagrams showing the steps of forming a ZnO thin film doped with As on a c-plane sapphire substrate.
Figure 1B:
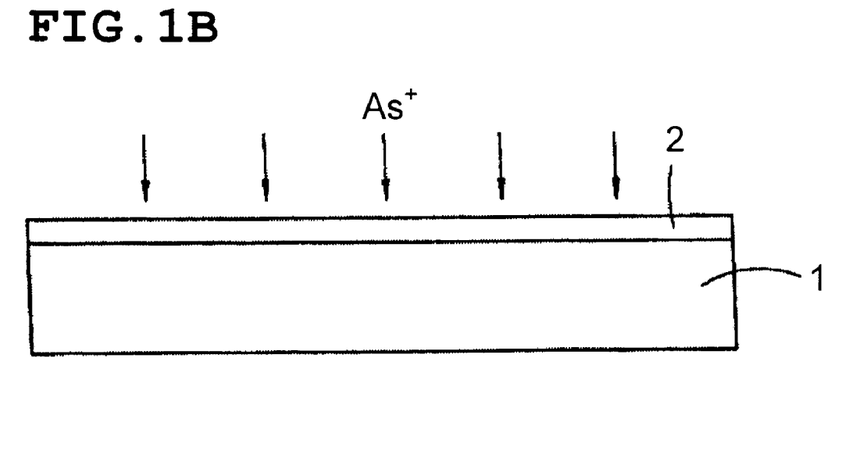

ZnO was epitaxially grown on a c-plane sapphire substrate 1 by sputtering using a Zn target with a purity of 99.9999% (6N), and thus a ZnO single-crystal thin film 2 with a thickness of 1 μm was formed on the c-plane sapphire substrate 1, as shown in FIG. 1A. The ZnO thin film 2 had a resistivity ρ of $10^8$ Ω·cm. Next, as shown in FIG. 1B, As$^+$ ions were implanted into the ZnO thin film 2 at an acceleration voltage of 40 kV. The doped ZnO thin film 2 had a resistivity of $10^7$ Ω·cm. The c-plane sapphire substrate 1 provided with the ZnO thin film 2 was then annealed at 460° C. for 2 hours. As a result, the resistivity was decreased to 10 Ω·cm. When another ZnO thin film having a resistivity of $10^6$ Ω·cm after deposition was subjected to ion implantation and annealing, the resistivity was decreased to 20 Ω·cm.

Figure 2:
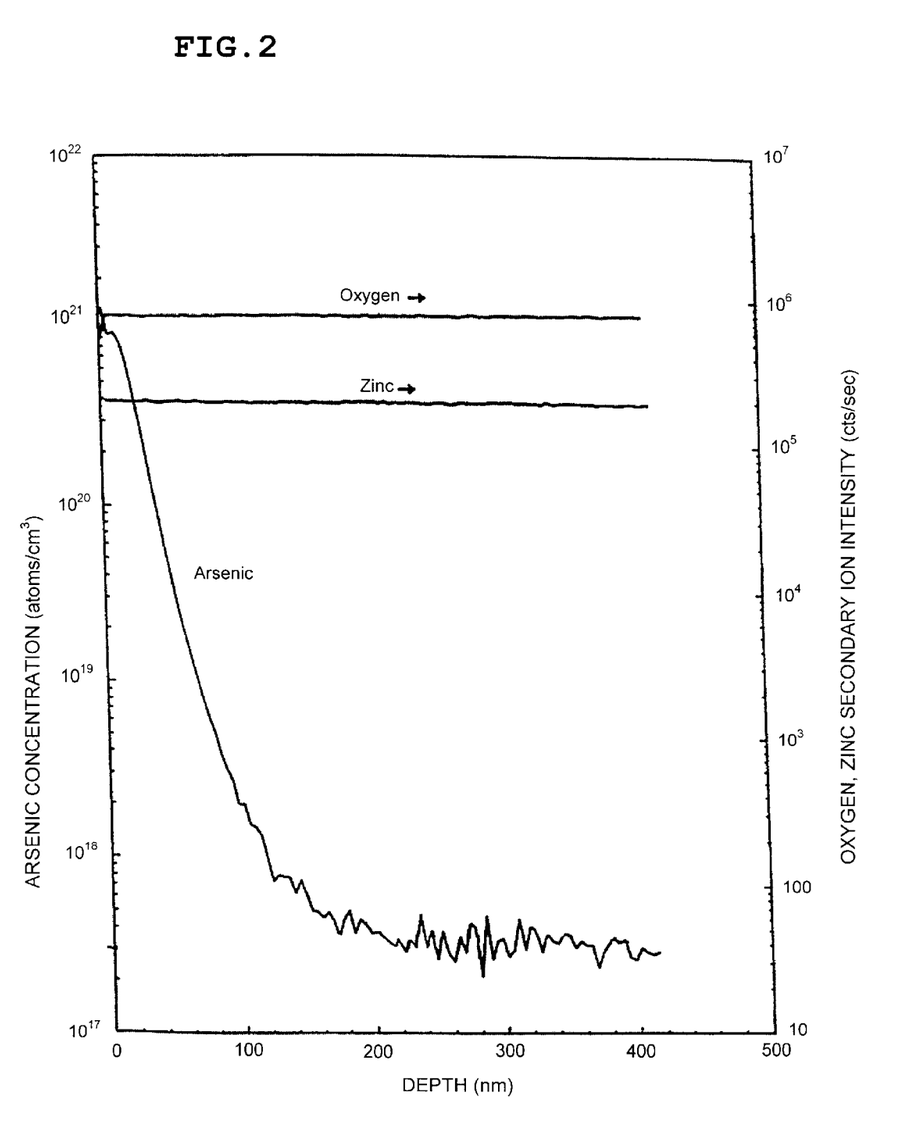
FIG. 2 is a graph showing the concentration profile of doped As in a ZnO thin film.

FIG. 2 is a graph showing the As ion concentration profile, obtained by secondary ion mass spectrometry (SIMS), in the ZnO thin film 2 formed on the c-plane sapphire substrate 1. As can be seen in FIG. 2, arsenic in an amount of $10^{21}$ atoms/cm$^3$ is implanted up to a depth of 0.02 μm from the surface, and arsenic in an amount of $10^{21}$ to $4\times10^{17}$ atoms/cm$^3$ is implanted in the region from 0.02 to 0.2 μm from the surface. In the region which is deeper than 0.2 μm, arsenic in an amount of $3\times10^{17}$ atoms/cm$^3$ is implanted.

Figure 3:
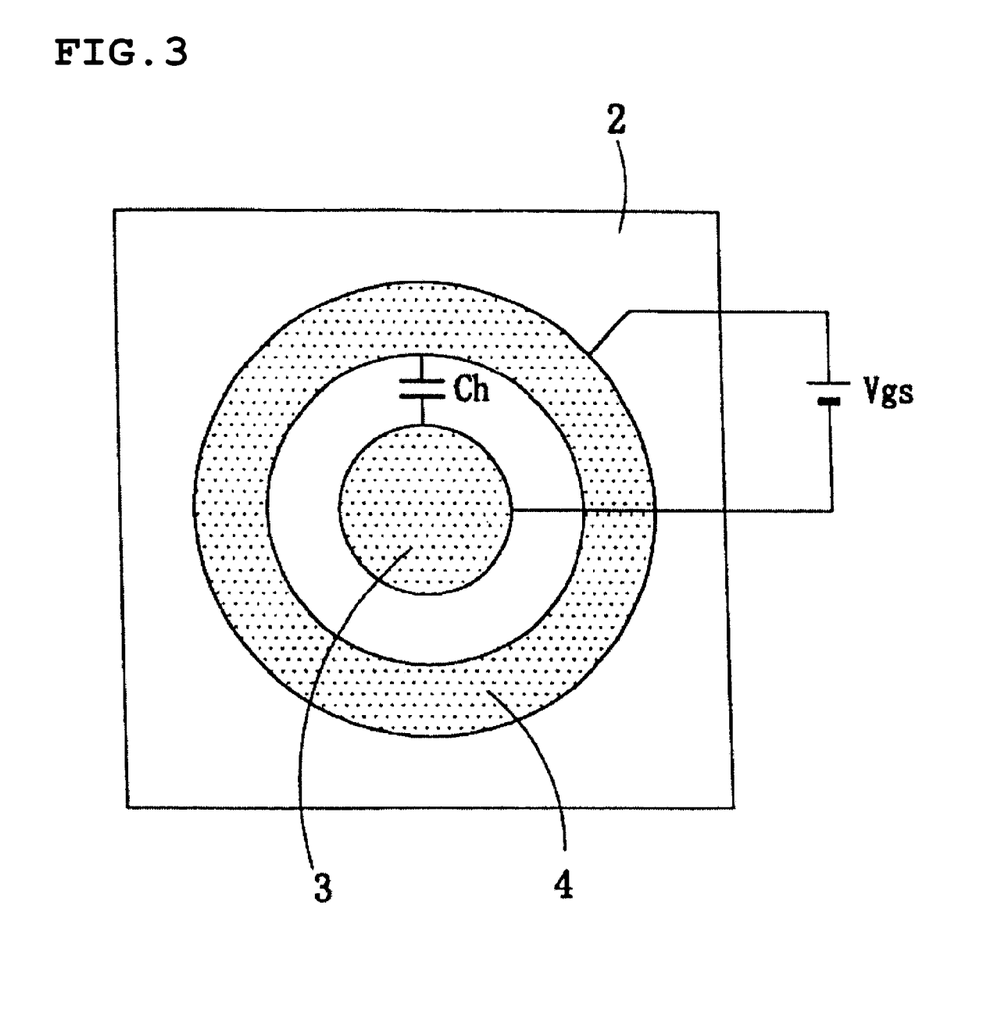
FIG. 3 is a schematic diagram showing a device for determining the conductive type of an As-doped ZnO thin film in a CV method.

Next, the conductive type of the As-doped ZnO thin film 2 was determined by observing CV characteristics. The CV characteristics are obtained by a method in which, as shown in FIG. 3, a circular electrode 3 and a ring electrode 4 are formed on an object to be measured (ZnO thin film 2), and the relationship between the voltage Vgs, between the circular electrode 3 and the ring electrode 4, and the capacitance Ch between both electrodes was measured. In a graph in which the horizontal axis represents the interelectrode voltage Vgs and the vertical axis represents the capacitance Ch, when the conductive type of the object to be measured is p-type, the CV characteristics are represented by a downward-sloping curve, and when the conductive type is n-type, the CV characteristics are represented by an upward-sloping curve. Therefore, by observing the CV characteristics, the conductive type of the object to be measured can be determined.

Figure 4:
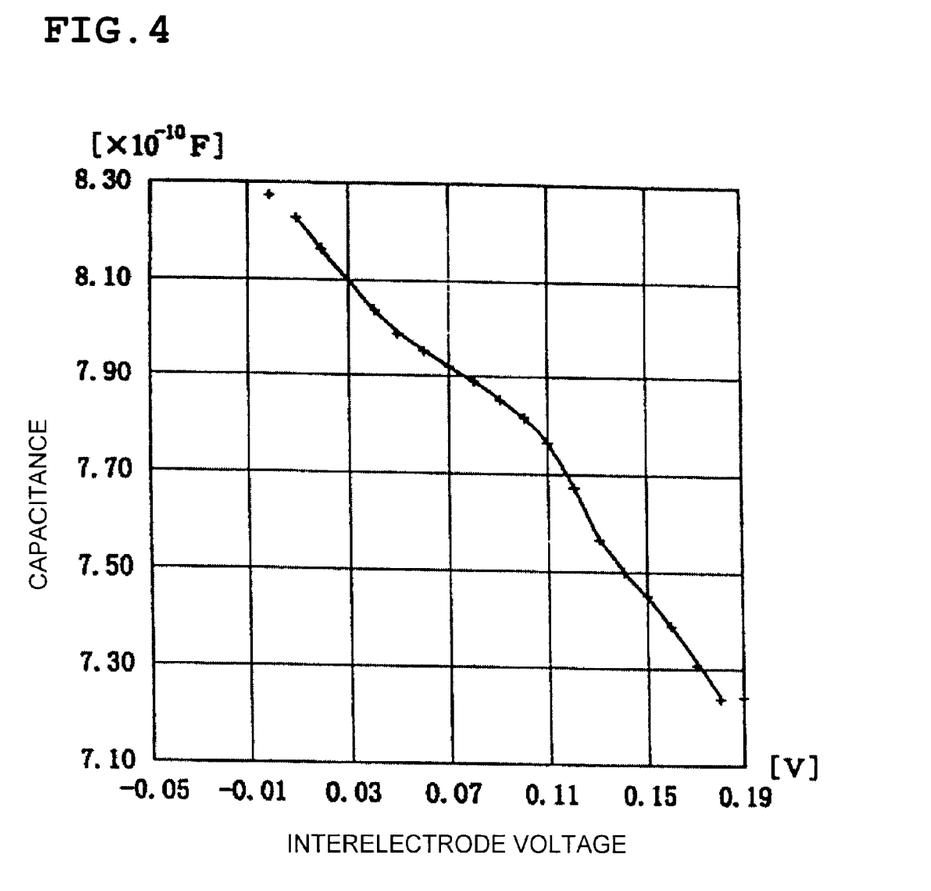
FIG. 4 is a graph showing the relationship between the interelectrode voltage and the interelectrode capacitance measured by the CV method.

FIG. 4 is a graph showing the CV characteristics of the As-doped ZnO thin film 2 formed as described above, in which the horizontal axis represents the interelectrode voltage Vgs and the vertical axis represents the capacitance Ch. As is obvious from FIG. 4, since the ZnO thin film 2 exhibited downward-sloping CV characteristics, the conduction type was determined to be p-type.

Similarly, when a ZnO thin film 2 with a resistivity ρ of $10^6$ to $10^8$ Ω·cm was annealed at 400° C. for 1 hour, the resistivity was 30 to 50 Ω·cm. This ZnO thin film 2 exhibited downward-sloping CV characteristics, and thus the conductivity type was determined to be p-type. When a ZnO thin film 2 was deposited using a Zn target with a purity of 99.999% (5N), the same results were obtained. Furthermore, when a ZnO ceramic target of 5N to 6N was used, the same results were obtained.

Although an example of ion implantation has been described, the same results were obtained when deposition was performed using a target in which any one of As, P, Sb, and Bi was mixed at a concentration of several percent. In such a case, the purity of the target excluding the dopant was 99.999% or more.

Next, a method for forming a semiconductor film using nitrogen as a p-type impurity will be described.

Figure 5:
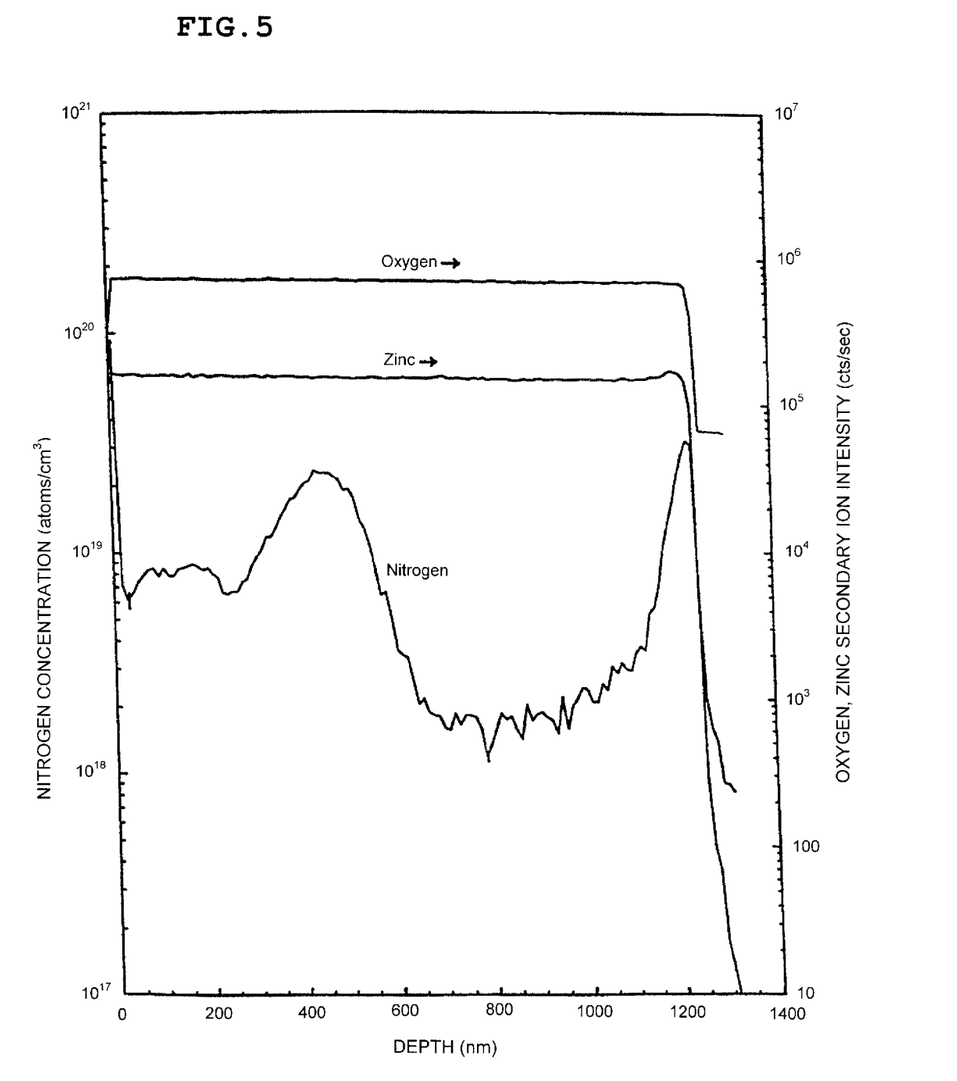
FIG. 5 is a graph showing the concentration profile of doped N in a ZnO thin film.

N$^+$ ions were implanted into a ZnO film of $10^8$ Ω·cm at an acceleration voltage of 35 kV for 5 minutes, at 100 kV for 2 minutes, and at 40 kV for 1 minute, and then the ZnO film was annealed at 460° C. for 2 hours. FIG. 5 is a graph showing the profile after the ion implantation. As shown in the graph, in the region very close to the surface (0 to 0.01 μm), nitrogen in an amount of $10^{20}$ atoms/cm$^3$ is implanted. In the region from 0.02 to 0.25 μm, nitrogen in an amount of $10^{19}$ atoms/cm$^3$ is implanted, and in the region from 0.7 to 1.1 μm, nitrogen in an amount of $10^{18}$ atoms/cm$^3$ is implanted.

Figure 6:
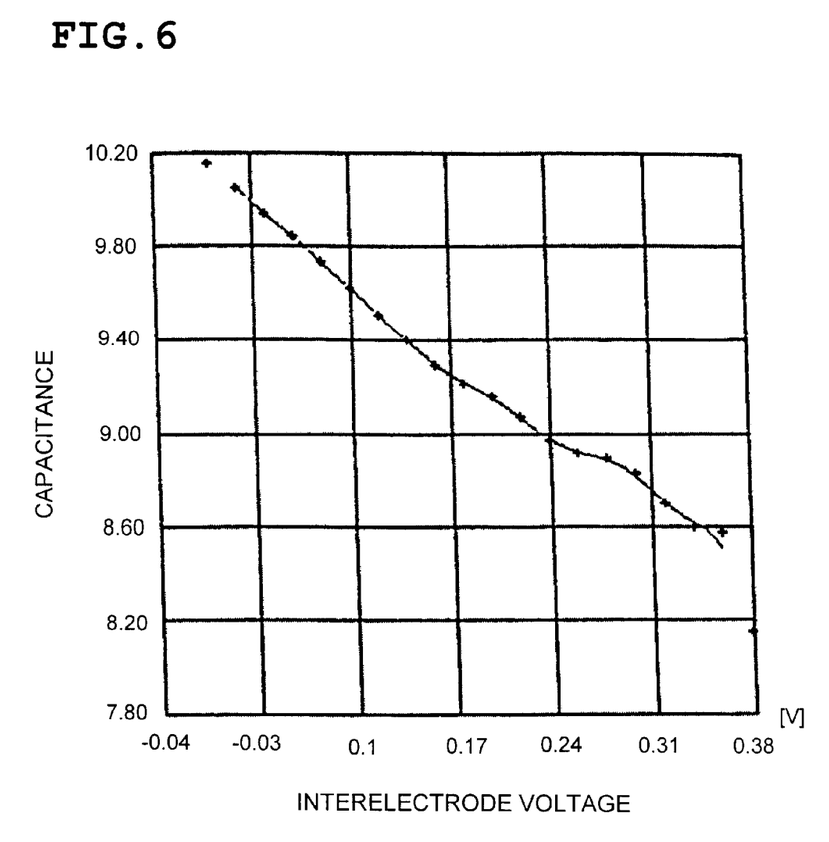
FIG. 6 is a graph showing the relationship between the interelectrode voltage and the interelectrode capacitance measured by the CV method with respect to an N-doped ZnO thin film.

FIG. 6 is a graph showing the CV characteristics of the ZnO film. As explained with reference to FIG. 3, since downward-sloping CV characteristics are exhibited in FIG. 6, the conductivity type of the ZnO film is p-type. The ZnO film had a resistivity of 7 Ω·cm. In the ZnO film which was activated at 480° C. for 2 hours after the implantation of nitrogen, the resistivity was 3 Ω·cm.

It is to be understood that the present invention is not limited to the above example, and if the amount of As or N ions to be implanted is increased, it is possible to decrease the resistivity to approximately 1 Ω·cm. It is also possible to form a p-type ZnO film using P, Sb, or Bi as a p-type impurity.

Figure 7:
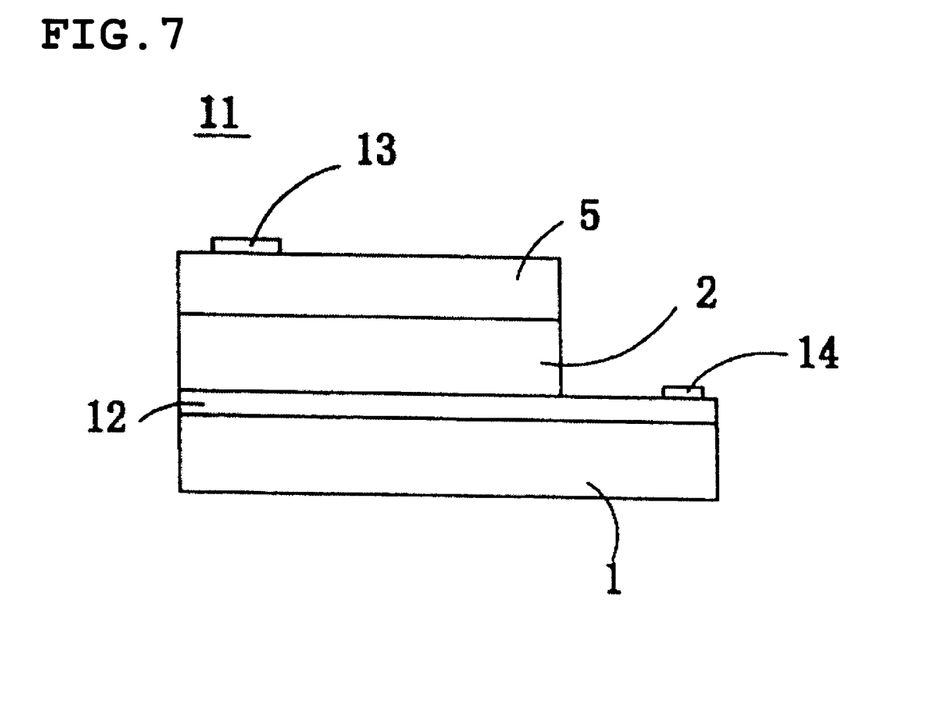
FIG. 7 is a schematic elevational view of a light emitting device in an embodiment of the present invention.

FIG. 7 is a schematic view of a light emitting device 11 in an embodiment of the present invention. In the light emitting device 11, a metallic thin film 12 is formed on a c-plane sapphire substrate 1, a ZnO thin film 2 is epitaxially grown thereon, and the ZnO thin film 2 is doped with As to form a p-type ZnO thin film 2. A ZnO thin film 5 is epitaxially grown further thereon, and the ZnO thin film 5 is doped with Al to form an n-type ZnO thin film 5. An upper electrode 13 and a lower electrode 14 are formed on the n-type ZnO thin film 5 and the metallic thin film 12, respectively. As the p-type ZnO thin film 2, the p-type ZnO film doped with any one of As, N, P, Sb, and Bi as described above may be used. As the n-type ZnO thin film 5, a known n-type ZnO film doped with Al or the like may be used.

In the light emitting device 11, when a voltage is applied between the upper electrode 13 and the lower electrode 14, light generated between the p-type ZnO thin film 2 and the n-type ZnO film 5 is emitted to the exterior from the n-type ZnO thin film 5.

Figure 8:
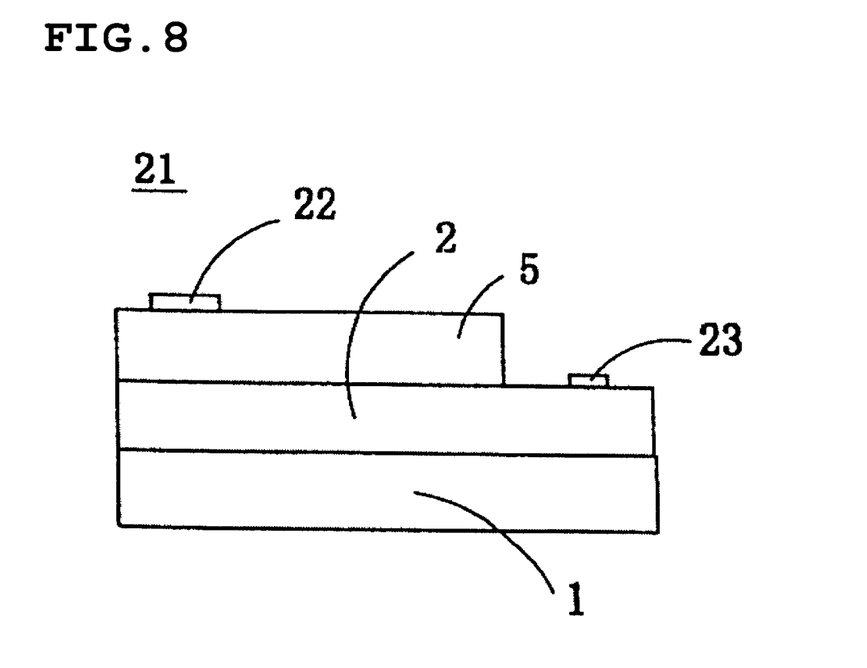
FIG. 8 is a schematic elevational view of a light emitting device in another embodiment of the present invention.

FIG. 8 is a schematic view of a light emitting device 21 in another embodiment of the present invention. In the light emitting device 21, a ZnO thin film 2 is epitaxially grown on a c-plane sapphire substrate 1, and the ZnO thin film 2 is doped with As to form a p-type ZnO thin film 2. A ZnO thin film 5 is epitaxially grown further thereon, and the ZnO thin film 5 is doped with Al to form an n-type ZnO thin film 5. A portion of the p-type ZnO thin film 2 is exposed from the n-type ZnO thin film 5, and an upper electrode 22 and a lower electrode 23 are formed on the n-type ZnO thin film 5 and the p-type ZnO thin film 2, respectively.

In the light emitting device 21, when a voltage is applied between the upper electrode 22 and the lower electrode 23, light produced between the p-type ZnO thin film 2 and the n-type ZnO thin film 5 is emitted to the exterior from the n-type ZnO thin film 5.

Although an n-type ZnO/p-type ZnO/sapphire structure is shown in FIG. 8, a p-type ZnO/n-type ZnO/sapphire structure may also be used. Additionally, in order to improve the crystallinity of the ZnO thin film, a ZnO buffer layer which is not doped with impurities may be provided between the c-plane sapphire substrate 1 and the ZnO thin film 2.

Preferably, the p-type ZnO film is a group II–VI compound semiconductor film containing p-type $Mg_XZn_{1-X}O$ ($0 \leq X \leq 1$) or $Cd_XZn_{1-X}O$ ($0 \leq X \leq 1$); and the n-type ZnO film is a group II–VI compound semiconductor film containing n-type $Mg_XZn_{1-X}O$ ($0 \leq X \leq 1$) or $Cd_XZn_{1-X}O$ ($0 \leq X \leq 1$).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for forming a p-type semiconductor film comprising the steps of:

providing on a substrate a group II–VI compound semiconductor film comprising one of ZnO, $Mg_XZn_{1-X}O$ ($0 \leq X \leq 1$) or $Cd_XZn_{1-X}O$ ($0 \leq X \leq 1$);

doping said semiconductor film with a p-type impurity by an ion implanting method; and activating the p-type impurity by annealing the doped semiconductor film at 450° C. or more until the resistivity of the doped semiconductor film is decreased to $10^6$ Ω·cm or less.

2. A method for forming a p-type semiconductor film according to claim 1, wherein the semiconductor film providing step includes the steps of:

sputtering a target made of either $Mg_XZn_{1-X}O$ ($0 \leq X \leq 1$) or $Cd_XZn_{1-X}O$ ($0 \leq X \leq 1$) to form the semiconductor film on the substrate.

3. A method for forming a p-type semiconductor film according to claim 1, wherein the p-type impurity comprises an element selected from the group consisting of As, N, P, Sb, and Bi.

4. A method for forming a p-type semiconductor film according to claim 2, wherein the semiconductor film has a resistivity of $10^6$ Ω·cm or more prior to being doped with the p-type impurity.

5. A method for forming a p-type semiconductor film according to claim 4, wherein the semiconductor film has a purity of 99.999% or more prior to being doped with the p-type impurity.

6. A method for forming a p-type semiconductor film according to claim 1, wherein the semiconductor film is doped with the p-type impurity in an amount of $10^{17}$ atoms/cm$^3$.

* * * * *